(12) United States Patent
Tsunoda et al.

(10) Patent No.: US 10,340,088 B2
(45) Date of Patent: Jul. 2, 2019

(54) THIN-FILM CAPACITOR

(71) Applicant: TDK CORPORATION, Tokyo (JP)

(72) Inventors: Koichi Tsunoda, Tokyo (JP);
Mitsuhiro Tomikawa, Tokyo (JP);
Kazuhiro Yoshikawa, Tokyo (JP);
Kenichi Yoshida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/899,403

(22) Filed: Feb. 20, 2018

(65) Prior Publication Data

US 2018/0240599 A1 Aug. 23, 2018

(30) Foreign Application Priority Data

Feb. 21, 2017 (JP) ................. 2017-030028

(51) Int. Cl.
*H01G 4/33* (2006.01)
*H01G 9/04* (2006.01)
*H01G 9/07* (2006.01)
*H01G 9/012* (2006.01)
*H01G 2/02* (2006.01)
*H01G 4/224* (2006.01)
*H01G 4/228* (2006.01)

(52) U.S. Cl.
CPC ............... *H01G 4/33* (2013.01); *H01G 2/02* (2013.01); *H01G 4/224* (2013.01); *H01G 4/228* (2013.01); *H01G 9/012* (2013.01); *H01G 9/04* (2013.01); *H01G 9/07* (2013.01); *H05K 2201/0179* (2013.01); *H05K 2201/0195* (2013.01)

(58) Field of Classification Search
CPC ............ H01G 4/33; H01G 4/008; H01G 4/30; H01G 4/12; H01G 4/224; H01G 4/228; H01G 4/555
See application file for complete search history.

(56) References Cited

U.S. PATENT DOCUMENTS

| 5,633,181 | A | 5/1997 | Hayashi |
| 5,822,175 | A | 10/1998 | Azuma |
| 5,929,473 | A | 7/1999 | Nishihori et al. |
| 6,027,947 | A | 2/2000 | Evans et al. |
| 6,225,185 | B1 | 5/2001 | Yamazaki et al. |
| 2002/0102768 | A1 | 8/2002 | Shioga et al. |
| 2002/0122287 | A1 | 9/2002 | Mido et al. |

(Continued)

FOREIGN PATENT DOCUMENTS

| JP | H08-097310 A | 4/1996 |
| JP | H10-093041 A | 4/1998 |

(Continued)

*Primary Examiner* — Nguyen T Ha
(74) *Attorney, Agent, or Firm* — Oliff PLC

(57) ABSTRACT

In a thin-film capacitor, an electrode terminal layer is divided into a plurality of parts by a penetration portion, and includes a frame portion as one divided part. The frame portion is disposed along an outer edge of the electrode terminal layer when viewed from the bottom surface side of the electrode terminal layer, and the frame portion can hinder deformation of the electrode terminal layer stretching or warping in a thickness direction or an in-plane direction, whereby such deformation can be prevented. Accordingly, in the thin-film capacitor, the electrode terminal layer is not likely to be deformed and an improvement in strength thereof is achieved.

3 Claims, 6 Drawing Sheets

(56) References Cited

U.S. PATENT DOCUMENTS

| | | |
|---|---|---|
| 2004/0018693 A1 | 1/2004 | Shioga et al. |
| 2004/0130849 A1 | 7/2004 | Kurihara et al. |
| 2005/0146838 A1 | 7/2005 | Shioga et al. |
| 2005/0156279 A1 | 7/2005 | Shioga et al. |
| 2006/0245139 A1 | 11/2006 | Kariya |
| 2006/0250749 A1 | 11/2006 | Kurihara et al. |
| 2007/0034989 A1 | 2/2007 | Shioga et al. |
| 2007/0139859 A1 | 6/2007 | Osaka et al. |
| 2007/0141800 A1 | 6/2007 | Kurihara et al. |
| 2008/0060743 A1* | 3/2008 | Minamikawa ....... H01G 4/1209 156/89.12 |
| 2008/0068780 A1 | 3/2008 | Shioga et al. |
| 2008/0145996 A1 | 6/2008 | Nomura et al. |
| 2008/0164563 A1 | 7/2008 | Nomura et al. |
| 2008/0315358 A1 | 12/2008 | Shioga et al. |
| 2009/0007405 A1 | 1/2009 | Shioga et al. |
| 2009/0166074 A1* | 7/2009 | Furuya ................... H01G 4/224 174/260 |
| 2009/0201624 A1 | 8/2009 | Hattori et al. |
| 2010/0053842 A1* | 3/2010 | Devoe ................... H01G 4/232 361/306.3 |
| 2010/0118468 A1 | 5/2010 | Nomura et al. |
| 2010/0246089 A1* | 9/2010 | Yano ....................... H01G 4/228 361/306.1 |
| 2011/0044011 A1 | 2/2011 | Ohtsuka et al. |
| 2011/0075319 A1 | 3/2011 | Oikawa et al. |
| 2011/0110016 A1 | 5/2011 | Takeshima et al. |
| 2011/0128669 A1 | 6/2011 | Yano et al. |
| 2011/0198608 A1* | 8/2011 | Yamanaka ............ G02F 1/1368 257/72 |
| 2012/0104545 A1 | 5/2012 | Takeshima et al. |
| 2012/0241204 A1* | 9/2012 | Matsumoto ......... H01L 21/4846 174/258 |
| 2016/0027579 A1 | 1/2016 | Kurachi et al. |
| 2016/0064473 A1 | 3/2016 | Morito et al. |
| 2016/0111211 A1* | 4/2016 | Aotani ................... H01G 4/255 361/301.4 |
| 2016/0163463 A1* | 6/2016 | Namikawa ............... H01G 4/33 361/301.3 |
| 2016/0293334 A1* | 10/2016 | Ehara ..................... H01G 1/008 |
| 2017/0290165 A1* | 10/2017 | Saita ...................... H05K 1/187 |
| 2017/0345576 A1* | 11/2017 | Tsuyoshi .................. H01G 4/33 |

FOREIGN PATENT DOCUMENTS

| | | |
|---|---|---|
| JP | 2002-222925 A | 8/2002 |
| JP | 2004-214589 A | 7/2004 |
| JP | 2007-081325 A | 3/2007 |
| JP | 2008-277520 A | 11/2008 |
| JP | 2009-194096 A | 8/2009 |
| JP | 2010-225849 A | 10/2010 |
| JP | 2011-040571 A | 2/2011 |
| JP | 2011-077343 A | 4/2011 |
| JP | 2014-090077 A | 5/2014 |
| JP | 2016-167619 A | 9/2016 |

* cited by examiner

THIN-FILM CAPACITOR

CROSS-REFERENCE TO RELATED APPLICATIONS

This application is based upon and claims the benefit of priority from Japanese Patent Application No. 2017-030028, filed on 21 Feb. 2017, the entire content of which is incorporated herein by reference.

TECHNICAL FIELD

The present disclosure relates to a thin-film capacitor.

BACKGROUND

In the related art, a thin-film capacitor in which a capacitor portion includes a dielectric film and an electrode film is known. For example, Japanese Unexamined Patent Publication No. 2007-81325 discloses a thin-film capacitor in which a capacitor portion including a dielectric film and an electrode film is formed on a silicon substrate.

SUMMARY

In such a thin-film capacitor, there is demand for a decrease in size to mount the thin-film capacitor on a small-size electronic device, but a decrease in thickness of the silicon substrate is likely to cause a brittle fracture. For example, when the thin-film capacitor is picked up or in a state in which the thin-film capacitor is mounted on an electronic device, a brittle fracture such as a crack may be caused.

Therefore, thin-film capacitors employing a substrate with high ductility formed of a metal material have been developed.

The inventors have studied thin-film capacitors including a substrate formed of a metal material and found a technique capable of achieving an improvement in strength of a thin-film capacitor.

According to the present disclosure, there is provided a thin-film capacitor with improved strength.

A thin-film capacitor according to an aspect of the invention includes: a substrate made of a metal material; a capacitor portion formed partially on one surface of the substrate, the capacitor having a stacked structure from stacking an electrode layer and a dielectric layer alternately; an insulating layer covering a forming region and a non-forming region, the capacitor formed in the forming region and not in the non-forming region on the one surface of the substrate; an electrode terminal disposed on the insulating layer; and a via conductor configured to penetrate the insulating layer in a thickness direction of the insulating layer and connect the electrode terminal to one of the substrate and the electrode layer of the capacitor portion, wherein the substrate is divided into a plurality of parts by a penetration portion penetrating the substrate in a thickness direction of the substrate, and includes a frame portion along an outer edge of the substrate and an electrode portion located inside the frame portion when viewed from the other surface side of the substrate, the electrode portion facing the electrode layer of the capacitor portion through the dielectric layer of the capacitor portion.

In the thin-film capacitor, the substrate formed of a metal material is divided into a plurality of parts by the penetration portion. The substrate includes a frame portion as one part of the plurality of divided parts. Since the frame portion is disposed along the outer edge of the substrate when viewed from the other surface side of the substrate, an improvement in strength of the thin-film capacitor is achieved.

The thin-film capacitor according to another aspect of the present disclosure further includes an insulating resin filling the inside of the penetration portion. In this case, it is possible to enhance electric insulation between the frame portion and the electrode portion.

In the thin-film capacitor according to another aspect of the present disclosure, the frame portion includes a communicating portion connecting a frame inside and a frame outside. In this case, it is possible to easily fill the penetration portion with an insulating resin.

DETAILED DESCRIPTION

Figure 1:
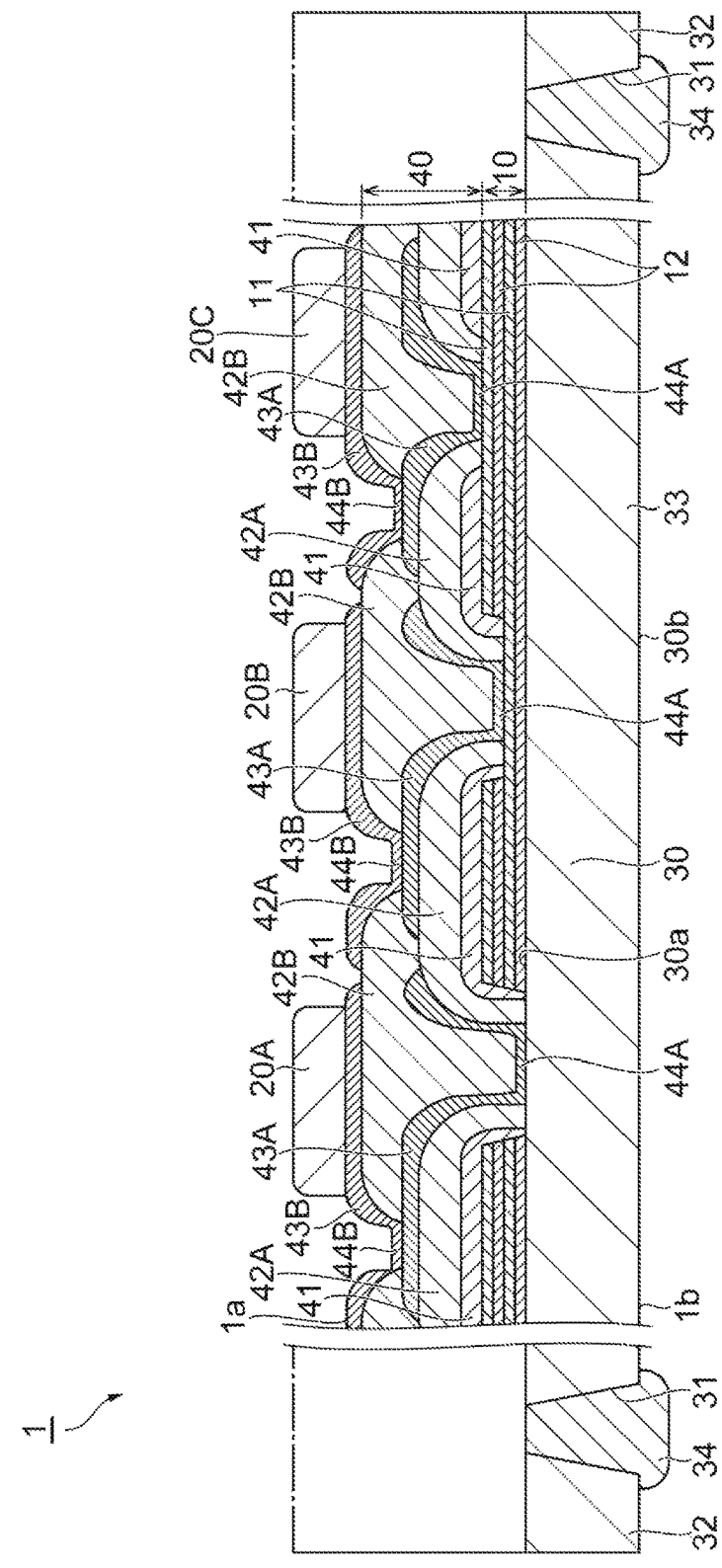
FIG. 1 is a sectional view schematically illustrating a part of a thin-film capacitor according to an embodiment of the present disclosure.

Hereinafter, various embodiments of the present disclosure will be described in detail with reference to the accompanying drawings. In the drawings, the same or corresponding elements will be referenced by the same reference signs and description thereof will not be repeated.

As illustrated in FIG. 1, a thin-film capacitor 1 according to an embodiment includes a capacitor portion 10 as a capacitor structure therein, includes electrode terminals 20A to 20C as electrode terminals drawn out from the capacitor portion 10 on one principal surface (a surface) 1a, and an electrode terminal layer 30 on the other principal surface (a back surface) 1b.

More specifically, the thin-film capacitor 1 includes an electrode terminal layer 30, a capacitor portion 10 that is partially formed on one surface 30a of the electrode terminal layer 30 and has a stacked structure in which an electrode layer 11 and a dielectric layer 12 are alternately stacked, an insulating layer 40 that covers a forming region in which the capacitor portion 10 is formed and a non-forming region in which the capacitor portion 10 is not formed on one surface (a surface) 30a of the electrode terminal layer 30, electrode terminals 20A to 20C that are formed on the insulating layer 40, and via conductors 43A and 43B that is formed to penetrate the insulating layer 40 in a thickness direction thereof and connects the electrode terminals 20A to 20C to one of the electrode terminal layer 30 and the electrode layers 11 of the capacitor portion 10.

The electrode terminals 20A to 20C are electrode terminals for connection to an electronic component (not illustrated) which is mounted on the thin-film capacitor 1, and the electronic component can be mounted on the principal surface on the side on which the electrode terminals 20A to 20C are formed.

The electrode terminal layer 30 can be connected to a wiring board (not illustrated) which supplies electric power to the electronic component mounted on the thin-film capacitor 1 via the thin-film capacitor. The thin-film capacitor 1 can be mounted on the wiring board with a posture in which the principal surface 1b on which the electrode terminal layer 30 is formed faces the wiring board.

The electrode terminal layer 30 is formed of a metal material having conductivity. Specifically, an alloy including nickel (Ni) or platinum (Pt) as a main component can be used as the conductive material of the electrode terminal layer 30, and particularly an alloy including Ni as a main component can be used. The purity of Ni in the electrode terminal layer 30 is preferably high and is more preferably equal to or greater than 99.99 wt %. Traces of impurities may be included in the electrode terminal layer 30. Examples of the impurities which can be included in the electrode terminal layer 30 formed of an alloy including Ni as a main component include a transition metal element or rare earth element such as iron (Fe), titanium (Ti), copper (Cu), aluminum (Al), magnesium (Mg), manganese (Mn), silicon (Si) or chromium (Cr), vanadium (V), zinc (Zn), niobium (Nb), tantalum (Ta), yttrium (Y), lanthanum (La), or cesium (Ce), chlorine (Cl), sulfur (S), and phosphorus (P). When the impurities diffuse from the electrode terminal layer 30 to the dielectric film at the time of manufacturing a thin-film capacitor, there is a likelihood that a performance deterioration such as a decrease in insulation resistance of the dielectric layer 12 will be caused.

The thickness of the electrode terminal layer 30 preferably ranges from 10 nm to 100 μm, more preferably ranges from 1 μm to 70 μm, and still more preferably ranges from 10 μm to 30 μm. When the thickness of the electrode terminal layer 30 is excessively small, there is a tendency for the electrode terminal layer 30 to be difficult to handle at the time of manufacturing the thin-film capacitor 1. When the thickness of the electrode terminal layer 30 is excessively large, there is a tendency for an effect of suppressing a leak current to be reduced. The area of the electrode terminal layer 30 is, for example, about 1×0.5 mm². The electrode terminal layer 30 may be formed of a metal foil and may be used together as a substrate and an electrode.

The capacitor portion 10 includes two electrode layers 11 and two dielectric layers 12 which are alternately stacked on the electrode terminal layer 30.

The electrode layers 11 are formed of a conductive material. Specifically, a material including nickel (Ni) or platinum (Pt) as a main component can be preferably used as the conductive material of the electrode layers 11, and particularly a material including Ni as a main component can be suitably used. When the material including Ni as a main component is used for the electrode layers 11, the content thereof is preferably equal to or greater than 50 mol % with respect to the whole electrode layers 11. When a main component of the electrode layers 11 is Ni, at least a kind (hereinafter referred to as an "additive element") selected from a group consisting of platinum (Pt), palladium (Pd), iridium (Ir), rhodium (Rh), ruthenium (Ru), osmium (Os), rhenium (Re), tungsten (W), chromium (Cr), tantalum (Ta), and silver (Ag) is additionally added. Since the electrode layers 11 include an additive element, breakage of the electrode layers 11 is prevented. The electrode layers 11 may include a plurality of kinds of additive elements. The thicknesses of the electrode layers 11 range, for example, from 10 nm to 1000 nm.

The dielectric layers 12 are formed of a (ferroelectric) dielectric material having a perovskite structure such as $BaTiO_3$ (barium titanate), $(Ba_{1-x}Sr_x)TiO_3$ (barium strontium titanate), $(Ba_{1-x}Ca_x)TiO_3$, $PbTiO_3$, or $Pb(Zr_xTi_{1-x})O_3$, a complex perovskite relaxer type ferroelectric material such as $Pb(Mg_{1/3}Nb_{2/3})O_3$, a bismuth-layered compound such as $Bi_4Ti_3O_{12}$ or $SrBi_2Ta_2O_9$, a tungsten-bronze type ferroelectric material such as $(Sr_{1-x}Ba_x)Nb_2O_6$ or $PbNb_2O_6$, or the like. Here, in the perovskite structure, the complex perovskite relaxer type ferroelectric material, the bismuth-layered compound, and the tungsten-bronze type ferroelectric material, a ratio of A site and B site is normally an integer ratio, but may be intentionally deviated from the integer ratio for the purpose of improvement in characteristics. In order to control characteristics of the dielectric layers 12, additives may be appropriately added as a secondary component to the dielectric layers 12. The thicknesses of the dielectric layers 12 range, for example, from 10 nm to 1000 nm.

The insulating layer 40 covers a forming region in which the capacitor portion 10 is formed and a non-forming region in which the capacitor portion 10 is not formed, and includes a passivation layer 41, a first insulating layer 42A, and a second insulating layer 42B.

The passivation layer 41 directly covers the capacitor portions 10 and is formed of an inorganic insulating material (for example, $SiO_2$).

The first insulating layer 42A covers the capacitor portion 10 in each area (each forming region) in which the capacitor portion 10 is formed in the electrode terminal layer 30. The second insulating layer 42B covers an area in which the first insulating layer 42A is not faulted, that is, an area (a non-forming region) in which the capacitor portion 10 is not formed, and partially covers the first insulating layer 42A at a circumferential edge of the non-forming region. That is, the electrode terminal layer 30 is covered by a two-stage configuration including the first insulating layer 42A and the second insulating layer 42B.

The material of the first insulating layer 42A and the second insulating layer 42B is not particularly limited as long as it is an insulating material, and, for example, a non-conductive resin such as polyimide, an inorganic material such as $SiO_2$, alumina, or SiN (silicon nitride), or an insulating material in which they are mixed or stacked can be used. The thickness of the first insulating layer 42A (a distance between the top surface of the passivation layer 41 and the top surface of the first insulating layer 42A) ranges, for example, from 0.5 μm to 10 μm, and the thickness of the second insulating layer 42B (a distance between the top surface of the first insulating layer 42A and the top surface of the second insulating layer 42B) ranges, for example, from 0.5 μm to 10 μm.

Between the first insulating layer 42A and the second insulating layer 42B, a first wiring portion 43A is formed along the top surface of the first insulating layer 42A. The first wiring portion 43A includes a contact portion 44A that extends vertically along the top surface of the first insulating layer 42A and comes into contact with the electrode terminal layer 30 or the electrode layers 11 at the bottom end thereof. A second wiring portion 43B is formed on the second insulating layer 42B along the top surface of the second insulating layer 42B. The second wiring portion 43B includes a contact portion 44B that extends vertically along the second insulating layer 42B and comes into contact with the first wiring portion 43A at the bottom end thereof. The electrode terminals 20A to 20C are formed on the second wiring portion 43B.

The contact portion 44B of the second wiring portion 43B on which the electrode terminal 20A is formed comes into contact with the first wiring portion 43A including the contact portion 44A which is in contact with the electrode terminal layer 30. The contact portion 44B of the second wiring portion 43B on which the electrode terminal 20B is formed comes into contact with the first wiring portion 43A including the contact portion 44A which is in contact with the lower electrode layer 11 of the capacitor portion 10. The contact portion 44B of the second wiring portion 43B on which the electrode terminal 20C is formed comes into contact with the first wiring portion 43A including the contact portion 44A which is in contact with the upper electrode layer 11 of the capacitor portion 10.

The first wiring portion 43A and the second wiring portion 43B serve as via conductors that are formed to penetrate the insulating layer 40 and connect the electrode terminals 20A to 20C to one of the electrode terminal layer 30 and the electrode layers 11 of the capacitor portion 10. The first wiring portion 43A and the second wiring portion 43B are formed of, for example, a conductive material such as copper (Cu). The electrode terminals 20A to 20C which are electrically connected to the second wiring portion 43B are formed of, for example, a conductive material such as copper (Cu).

Figure 2:
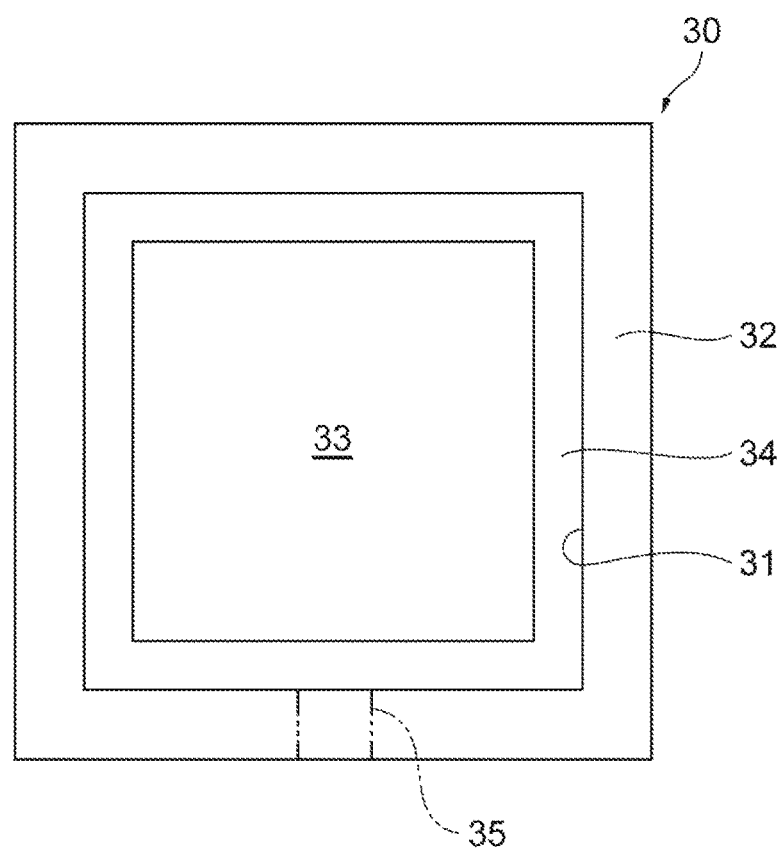
FIG. 2 is a bottom view of a substrate of the thin-film capacitor illustrated in FIG. 1.

In the thin-film capacitor 1, the electrode terminal layer 30 is divided into a plurality of parts by a penetration portion 31 that penetrates the electrode terminal layer 30 in the thickness direction thereof. Specifically, as illustrated in FIG. 2, the electrode terminal layer 30 includes a frame portion 32 and an electrode portion 33 which are partitioned by the penetration portion 31 when viewed from the principal surface (the bottom surface) 30b opposite to the surface 30a of the electrode terminal layer 30.

The frame portion 32 is a portion with a rectangular ring shape along the circumferential edge of the bottom surface 30b with a rectangular ring shape of the electrode terminal layer 30. The frame portion 32 is designed to have a substantially constant width.

The penetration portion 31 is located on the inner circumference side of the frame portion 32 and has a rectangular ring shape. The penetration portion 31 is designed to have a substantially constant width, similarly to the frame portion 32.

The electrode portion 33 is a portion with a rectangular shape located inside the frame portion 32. As illustrated in FIG. 1, the electrode portion 33 is electrically connected to the electrode terminal 20A via the via conductors 43A and 43B, and faces the electrode layer 11 with the dielectric layer 12 of the capacitor portion 10 interposed therebetween. The electrode portion 33 also serves as an electrode terminal when it is connected to the wiring board.

The whole inside of the penetration portion 31 is buried in an insulating resin 34 having a larger thickness than the thickness of the electrode terminal layer 30. The insulating resin 34 is, for example, an epoxy resin. Accordingly, high electric insulation between the frame portion 32 and the electrode portion 33 is achieved.

A method of manufacturing the thin-film capacitor 1 will be described below with reference to FIGS. 3A to 3E and FIGS. 4A to 4D. FIGS. 3A to 3E and FIGS. 4A to 4D are enlarged views of a part of the thin-film capacitor 1 in the middle of manufacturing the thin-film capacitor. Actually, a plurality of thin-film capacitors 1 are formed together and then are fragmented to individual thin-film capacitors 1.

Figure 3A:
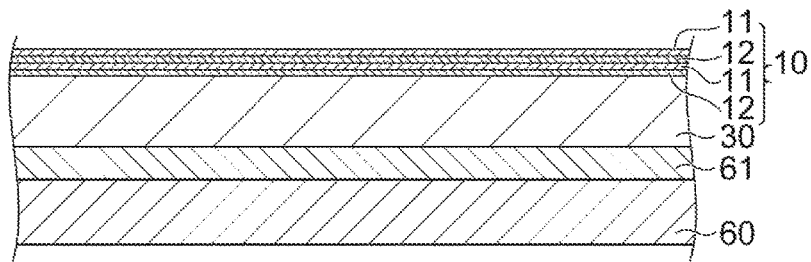
FIGS. 3A to 3E are diagrams illustrating a method of manufacturing the thin-film capacitor illustrated in FIG. 1.

First, as illustrated in FIG. 3A, a metal foil which becomes the electrode terminal layer 30 and which is supported by a support material 60 with a temporary pasting material 61 interposed therebetween is prepared, and the dielectric layer 12 and the electrode layer 11 which become the capacitor portion 10 are alternately formed on the electrode terminal layer 30. The metal foil which becomes the electrode terminal layer 30 is polished such that the surface thereof has predetermined arithmetic mean roughness Ra if necessary. This polishing can be performed using a method such as a chemical mechanical polishing (CMP) method, an electrolytic polishing method, or a buffing method. An example of the method of forming the electrode layer 11 is a DC sputtering method. As the method of forming the dielectric layer 12, a film formation technique of a physical vapor deposition method (PVD) method or a chemical vapor deposition (CVD) method such as a solution method or a sputtering method can be used, and, for example, a sputtering method can be used.

Figure 3B:
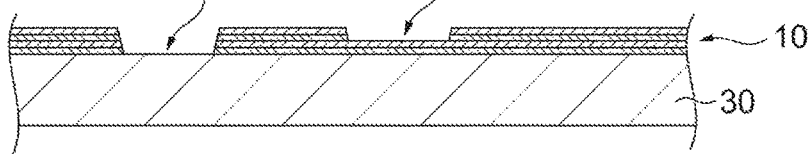

Then, as illustrated in FIG. 3B, a predetermined opening 70 penetrating the electrode layers 11 and the dielectric layers 12 is formed. For example, formation of the opening 70 is performed by dry etching with a patterned resist as a mask. Through this process, two openings 71 and 72 are formed in the electrode layers 11 and the dielectric layers 12. In the opening 71, the electrode terminal layer 30 is exposed from the bottom surface and a continuous side surface including the electrode layers 11 and the dielectric layers 12 is formed in the capacitor portion 10. In the opening 72, the lower electrode layer 11 is exposed from the bottom surface and a continuous side surface including the electrode layers 11 and the dielectric layers 12 is formed in the capacitor portion 10.

Thereafter, the support material 60 is removed along with the temporary pasting material 61 and a stacked body in which the electrode layer 11 and the dielectric layer 12 are stacked on the electrode terminal layer 30 are baked. The baking temperature can be set to a temperature at which the dielectric layer is sintered (crystallized) and specifically set to range from 500° C. to 1000° C. The baking time can be set to range from 5 minutes to 2 hours. The baking atmosphere is not particularly limited, and may be one of an oxidizing atmosphere, a reducing atmosphere, and a neutral atmosphere. The baking can be performed under an oxygen partial pressure at which the electrode layer 11 is not oxidized. The baking time is not limited to this time and, for example, the baking may be performed before the opening 70 is formed or may be performed after the opening 70 is formed.

Figure 3C:
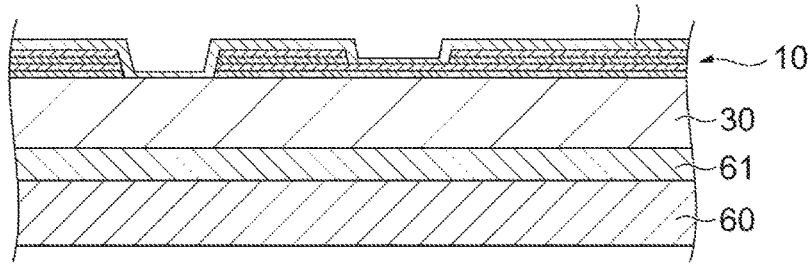

Then, as illustrated in FIG. 3C, a support material 60 is attached to the electrode terminal layer 30 with a temporary pasting material 61 interposed therebetween, and an inorganic insulating layer (for example, a $SiO_2$ layer) which becomes the passivation layer 41 is formed in a state in which the electrode terminal layer 30 is supported by the support material 60.

Figure 3D:
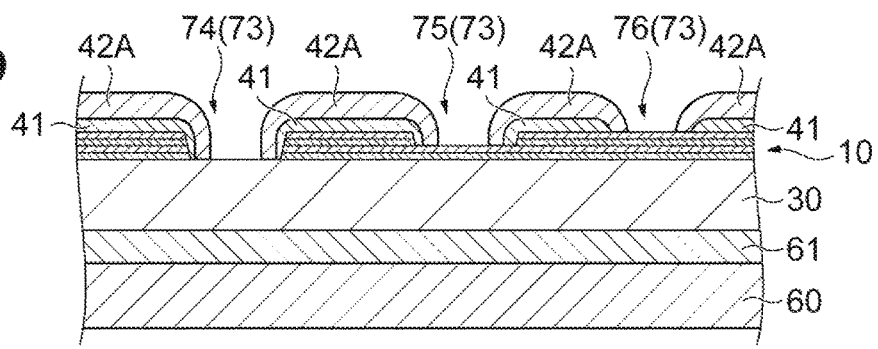

Subsequently, as illustrated in FIG. 3D, the first insulating layer 42A is formed on the electrode layers 11 and the dielectric layers 12. The first insulating layer 42A is formed, for example, by applying an uncured thermosetting resin and heating and curing the thermosetting resin. The first insulating layer 42A may be formed by applying an uncured photo-curing resin and irradiating the photo-curing resin with light of a specific wavelength to cure the photo-curing resin. After the insulating material constituting the first insulating layer 42A has been cured, a predetermined opening 73 for forming the first wiring portion 43A is formed by dry etching or the like. In this embodiment, three openings 74, 75, and 76 are formed as the opening 73. The opening 74 is formed in the vicinity of the center of the opening 71 such that the first insulating layer 42A in the opening 71 is penetrated. The opening 75 is formed in the vicinity of the center of the opening 72 such that the first insulating layer 42A in the opening 72 is penetrated. The opening 76 is formed to penetrate the first insulating layer 42A in a predetermined area. Through this process, the electrode terminal layer 30 is exposed from the bottom surface of the opening 74, the lower electrode layer 11 is exposed from the bottom surface of the opening 75, and the upper electrode layer 11 is exposed from the bottom surface of the opening 76. The electrode layers 11 and the dielectric layers 12 are sealed by the first insulating layer 42A.

Figure 3E:
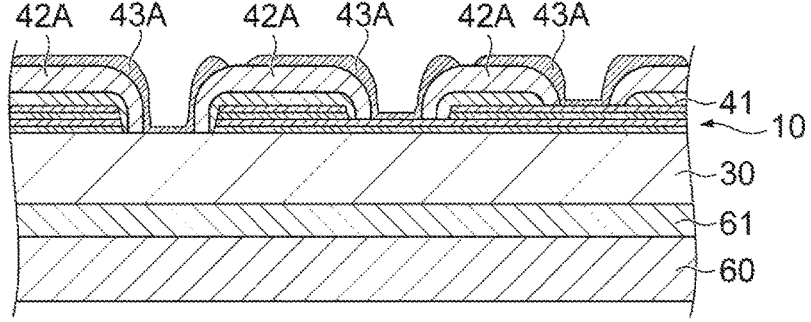

Then, as illustrated in FIG. 3E, the first wiring portion 43A is formed inside the opening 73 of the first insulating layer 42A and on the first insulating layer 42A at the opening edge. The first wiring portion 43A is formed, for example, by sputtering or depositing a conductive material such as a copper (Cu) and then performing patterning by etching. Through this process, a plurality of first wiring portions 43A which are electrically isolated from each other are formed. At this time, the first wiring portion 43A formed around the opening 74 is electrically connected to the electrode terminal layer 30, the first wiring portion 43A formed around the opening 75 is electrically connected to the lower electrode layer 11, and the first wiring portion 43A formed around the opening 76 is electrically connected to the upper electrode layer 11.

Figure 4A:
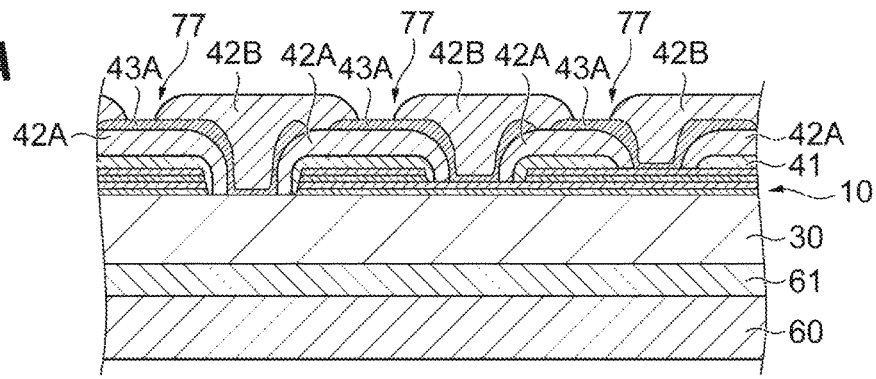
FIGS. 4A to 4D are diagrams illustrating the method of manufacturing the thin-film capacitor illustrated in FIG. 1.

Then, as illustrated in FIG. 4A, the second insulating layer 42B is formed on the first insulating layer 42A and the first wiring portion 43A. Similarly to the first insulating layer 42A, the second insulating layer 42B is formed, for example, by applying an uncured thermosetting resin and then heating and curing the thermosetting resin. After an insulating material constituting the second insulating layer 42B has been cured, three openings 77 for forming the second wiring portion 43B are formed by dry etching or the like. Through this process, the first wiring portion 43A is exposed from the openings 77.

Figure 4B:
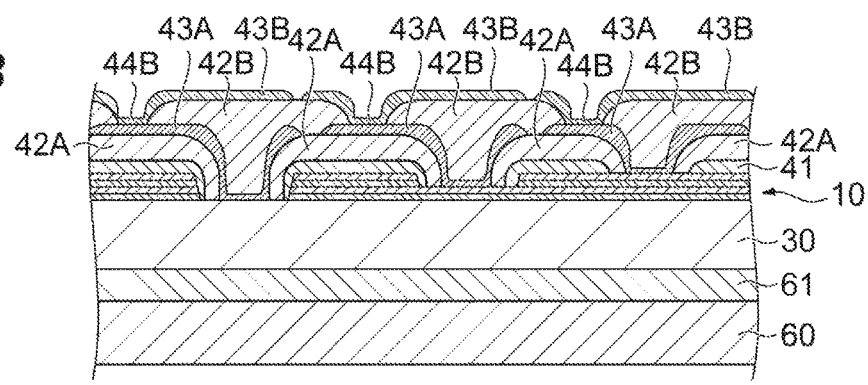

Then, as illustrated in FIG. 4B, the second wiring portion 43B is formed inside the openings 777 of the second insulating layer 42B and on the second insulating layer 42B at the circumferential edges of the openings. Similarly to the first wiring portion 43A, the second wiring portion 43B is formed, for example, by sputtering or depositing a conductive material such as copper (Cu) and then patterning the conductive material by etching. Through this process, a plurality of second wiring portions 43B which are electrically isolated from each other are formed. At this time, the second wiring portions 43B formed around the openings 77 are electrically connected to the first wiring portions 43A.

Figure 4C:
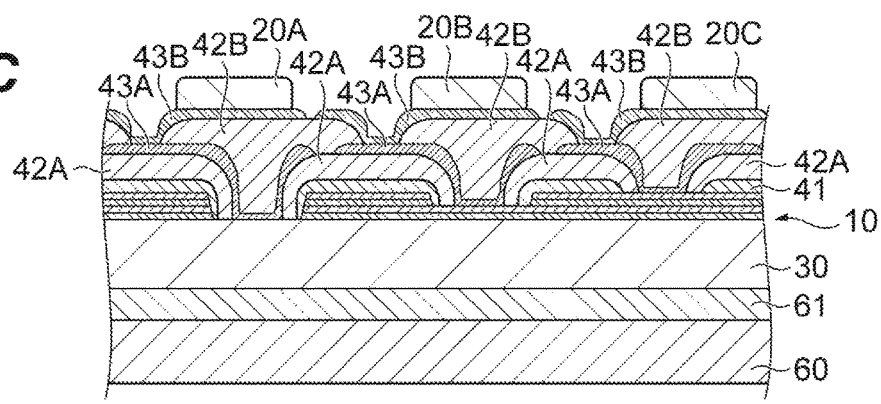

Then, as illustrated in FIG. 4C, the electrode terminals 20A to 20C for electrically connecting the thin-film capacitor 1 to an external electronic component are formed on the second wiring portions 43B. The electrode terminals 20A to 20C are formed, for example, by forming a layer of a conductive material such as copper (Cu) by plating or the like and then performing etching or the like.

Figure 4D:
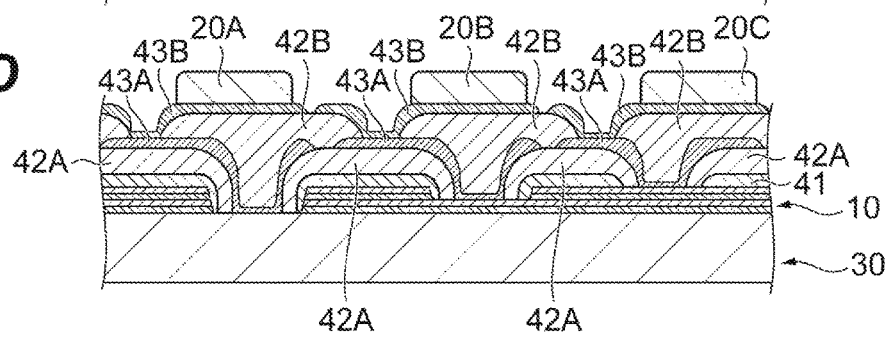

Finally, as illustrated in FIG. 4D, the support material 60 along with the temporary pasting material 61 is removed. Then, the penetration portion 31 is formed in the electrode terminal layer 30 to partition the electrode terminal layer 30 into the frame portion 32 and the electrode portion 33. The penetration portion 31 is formed, for example, by wet etching. The penetration portion 31 is filled with an insulating resin 34. The filling with the insulating resin 34 is performed, for example, by laminating a film. Thereafter, by performing fragmentation by dicing or the like, the thin-film capacitor 1 illustrated in FIG. 1 is obtained.

In the thin-film capacitor 1, the electrode terminal layer (substrate) 30 is partitioned into a plurality of parts by the penetration portion 31, and includes a frame portion 32 as one partitioned part. The frame portion 32 is disposed along the outer edge of the electrode terminal layer 30 when viewed from the bottom surface 30b of the electrode terminal layer 30, and the frame portion 32 can hinder deformation of the electrode terminal layer 30 stretching or warping in the thickness direction or the in-plane direction thereof, whereby such deformation can be prevented. Accordingly, in the thin-film capacitor 1, the electrode terminal layer 30 is not likely to be deformed and an improvement in strength is achieved.

The penetration portion 31 is a closed shape of a rectangular ring. Accordingly, when the penetration portion 31 is filled with the insulating resin 34, the insulating resin 34 is likely to stay in the penetration portion 31 and thus it is possible to easily perform the filling while restricting flowing of the insulating resin 34. When the insulating resin 34 flows out of the penetration portion 31 at the time of filling, handleability or quality of a product may be considered to be affected, but since the penetration portion 31 has a closed shape, the insulating resin 34 is not likely to flow out of the penetration portion 31. Here, the penetration portion 31 may not have a closed shape, but may be connected to the frame outside via a communicating portion 35 which is formed in the frame portion 32 as illustrated in FIG. 2. The communicating portion 35 connects the frame inside of the frame portion 32 to the frame outside and is formed, for example, as a cutout. When the penetration portion 31 is filled with the insulating resin 34, fluidity of the resin is low due to viscosity of the resin, bubbles in the resin, or the like and then it may be difficult to uniformly fill the penetration portion. By providing the communicating portion 35 in the frame portion 32, it is possible to improve fluidity of the resin at the time of filling and to achieve more uniform filling.

The electrode terminal layer 30 and the electrode layers 11 of the capacitor portion 10 are connected to the electrode terminals 20A to 20C by via conductors (that is, the first wiring portions 43A and the second wiring portions 43B) formed to penetrate the insulating layer 40 in the thickness direction thereof. When a wire creeps about in a plane perpendicular to the thickness direction of the thin-film capacitor, a detour of a circuit wire or the like occurs and the wire is lengthened, but a short circuit wire in the thickness direction is realized by the via conductors 43A and 43B in the thin-film capacitor 1. That is, in the thin-film capacitor 1, it is possible to achieve an increase in the number of terminals in the plurality of electrode terminals 20A to 20C and a decrease in length of the circuit wire and thus to obtain a thin-film capacitor with reduced ESL.

In the thin-film capacitor 1, rewiring is performed by employing a two-stage configuration of the first insulating layer 42A and the second insulating layer 42B. That is, the position of the first wiring portion 43A is restricted to a position just above the capacitor portion 10 or the vicinity thereof, but the position of the second wiring portion 43B is not limited to the position and can be freely determined. Accordingly, it is possible to enhance a degree of freedom in design of positions of the electrode terminals 20A to 20C which are formed on the second wiring portion 43B. A plurality of second wiring portions 43B can be drawn out from one first wiring portion 43A. In this case, it is possible to easily achieve an increase in the number of terminals of the electrode terminals 20A to 20C.

In the thin-film capacitor 1, the thickness of the insulating layer 40 is larger than the thickness of the capacitor portion 10. In this way, when the thickness of the insulating layer 40 is large, ESL is likely to increase, but it is possible to achieve an effective decrease in ESL by the decrease in length of the circuit wire due to the via conductors 43A and 43B. The thickness of the electrode terminal layer 30 is larger than the thickness of the capacitor portion 10.

The thin-film capacitor is not limited to the above-mentioned embodiment, and can be modified in various forms.

Figure 5:
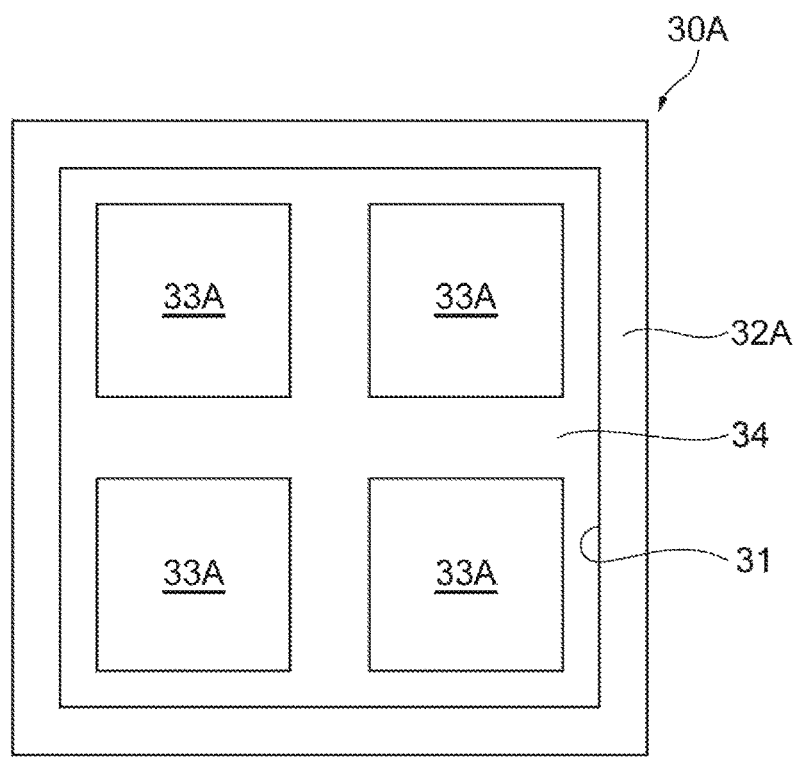
FIG. 5 is a bottom view of a substrate of a thin-film capacitor according to another embodiment.
Figure 6:
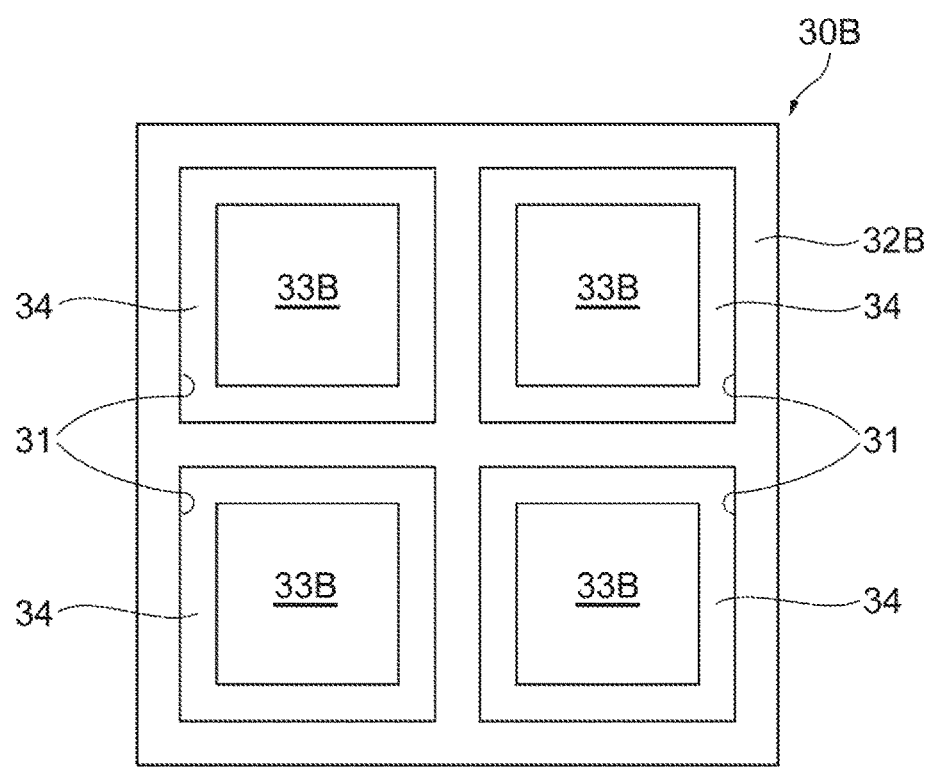
FIG. 6 is a bottom view of a substrate of a thin-film capacitor according to another embodiment.

For example, the electrode terminal layer 30 is not limited to the above-mentioned shape, but may have shapes illustrated in FIGS. 5 and 6.

An electrode terminal layer 30A illustrated in FIG. 5 includes four electrode portions 33A having the same configuration and function as the above-mentioned electrode portion 33 in a frame portion 32A having a rectangular ring shape along the circumferential edge of a bottom surface 30b thereof. With this electrode terminal layer 30A including a plurality of electrode portions 33A, it is possible to achieve the same or similar advantages as with the above-mentioned electrode terminal layer 30.

An electrode terminal layer 30B illustrated in FIG. 6 includes a frame portion 32A which is formed along the circumferential edge of a bottom surface 30b thereof and is divided into four small parts with a rectangular shape, and an electrode portion 33B having the same configuration and function as the above-mentioned electrode portion 33 is disposed in each of the four small parts. With this electrode terminal layer 30B including a frame portion 32B which is divided into a plurality of parts, it is possible to achieve the same or similar advantages as with the above-mentioned electrode terminal layer 30.

The shape of the frame portion of the electrode terminal layer is not limited to the rectangular ring shape. For example, a ring shape of a polygonal shape (such as a triangular shape or a hexagonal shape) other than the rectangular shape may be employed, or a circular ring shape or an elliptical ring shape may be employed.

The above-mentioned frame portions 32, 32A, and 32B may be electrically connected to one of the electrode terminals 20A to 20C via the via conductors 43A and 43B, similarly to the electrode portion 33. The frame portions 32, 32A, and 32B may be connected to the wiring board and may be used as electrode terminals.

The via conductor is not limited to the configuration of the above-mentioned via conductors 43A and 43B, and may be a via conductor having a configuration in which a through-hole extending straightly in the thickness direction of the insulating layer is filled with a conductor. In the thin-film capacitor, the insulating layer is configured to have a two-stage configuration for rewiring, but a multi-stage configuration of three or more stages may be employed or a single-stage configuration may be employed. In the capacitor portion, the number of layers of the electrode layers and the dielectric layers can be appropriately increased or decreased.

What is claimed is:

1. A thin-film capacitor comprising:
   a substrate made of a metal material;
   a capacitor portion formed partially on one surface of the substrate, the capacitor having a stacked structure from stacking an electrode layer and a dielectric layer alternately;
   an insulating layer covering a forming region and a non-forming region, the capacitor portion formed in the forming region and not formed in the non-forming region on the one surface of the substrate;
   an electrode terminal disposed on the insulating layer; and
   a via conductor configured to penetrate the insulating layer in a thickness direction of the insulating layer and connect the electrode terminal to one of the substrate and the electrode layer of the capacitor portion,
   wherein: the substrate is divided into a plurality of parts by a penetration portion penetrating the substrate in a thickness direction of the substrate, and includes a frame portion along an outer edge of the substrate and an electrode portion located inside the frame portion when viewed from the other surface side of the substrate, the electrode portion facing the electrode layer of the capacitor portion through the dielectric layer of the capacitor portion; and
   the frame portion includes a communicating channel that extends in a direction orthogonal to the thickness direction of the substrate to connect a frame inside and a frame outside.

2. The thin-film capacitor according to claim 1, further comprising an insulating resin filling the inside of the penetration portion.

3. The thin-film capacitor according to claim 1, wherein:
   the substrate is an electrode terminal layer provided on one side of the thin-film capacitor; and
   the electrode terminal disposed on the insulating layer is provided on another side of the thin-film capacitor.

* * * * *